United States Patent
Patel et al.

(10) Patent No.: US 12,057,860 B1
(45) Date of Patent: *Aug. 6, 2024

(54) LOSSY STATISTICAL DATA COMPRESSION

(71) Applicant: Cox Communications, Inc., Atlanta, GA (US)

(72) Inventors: Jignesh B. Patel, Lilburn, GA (US); Pavan Kumar Surapaneni, Suwanee, GA (US); Pavan Chandrashekar, Atlanta, GA (US); Marco Antonio Valero, Marietta, GA (US); Kyle Allen Cooper, Cumming, GA (US)

(73) Assignee: COX COMMUNICATIONS, INC., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/897,508

(22) Filed: Aug. 29, 2022

Related U.S. Application Data

(63) Continuation of application No. 17/168,978, filed on Feb. 5, 2021, now Pat. No. 11,431,350.

(51) Int. Cl.
*H03M 7/34* (2006.01)
*H03M 7/30* (2006.01)

(52) U.S. Cl.
CPC ....... *H03M 7/3059* (2013.01); *H03M 7/6058* (2013.01)

(58) Field of Classification Search
CPC .... H03M 7/30; H03M 7/3059; H03M 7/3062; H03M 7/3073; H03M 7/3088; H03M 7/40; H03M 7/4006; H03M 7/6011; H03M 7/6041; H03M 7/6047; H03M 7/6058; H03M 7/607; G06F 3/0608; G06F 11/1004; G06F 3/064; G06F 3/0652; G06F 3/0673; G06F 3/0679
USPC .......................................................... 341/50
See application file for complete search history.

(56) References Cited

U.S. PATENT DOCUMENTS

| | | | |
|---|---|---|---|
| 6,317,520 B1 | 11/2001 | Passaggio et al. | |
| 9,489,659 B1 | 11/2016 | Liu et al. | |
| 9,619,588 B1 | 4/2017 | Lyons | |
| 10,284,224 B2 * | 5/2019 | Pamula | H03M 7/3059 |
| 10,444,995 B2 * | 10/2019 | Cashman | G06F 3/067 |
| 10,827,039 B1 * | 11/2020 | Dandekar | H04L 69/04 |
| 11,431,350 B1 * | 8/2022 | Patel | H03M 7/3059 |
| 11,620,336 B1 * | 4/2023 | Batsakis | G06F 16/27 707/722 |
| 2004/0113820 A1 * | 6/2004 | Leanza | H03M 7/30 341/50 |
| 2007/0136599 A1 | 6/2007 | Suga | |

(Continued)

*Primary Examiner* — Linh V Nguyen

(74) *Attorney, Agent, or Firm* — Merchant & Gould P.C.

(57) ABSTRACT

A method performed in real-time includes receiving and storing time-based data over a specific time period and dividing the specific time period into a plurality of time windows. The method further includes determining that data associated with two or more proximate time windows are within a predetermined variance of one another and responsive to the determination: generating a mathematical function representative of the data associated with the two or more proximate time windows, deleting the data associated with the two or more proximate time windows, and generating a representation of the deleted data from the mathematical function. In certain embodiments, the data comprises empirical network telemetry data.

20 Claims, 6 Drawing Sheets

(56) References Cited

U.S. PATENT DOCUMENTS

| | | | |
|---|---|---|---|
| 2014/0046990 A1* | 2/2014 | Kmiecik | A61B 5/7232 |
| | | | 708/203 |
| 2017/0177227 A1 | 6/2017 | Zhang et al. | |
| 2018/0367161 A1 | 12/2018 | Ki et al. | |
| 2019/0320090 A1 | 10/2019 | Popa | |
| 2020/0038764 A1* | 2/2020 | Perlman | H04N 21/2385 |
| 2020/0230505 A1 | 7/2020 | van der Laan et al. | |
| 2021/0273648 A1 | 9/2021 | Lasserre et al. | |
| 2022/0014209 A1* | 1/2022 | Lin | H03M 7/3059 |
| 2022/0035526 A1* | 2/2022 | Lv | G06F 3/064 |
| 2022/0066678 A1* | 3/2022 | Singidi | G06F 3/064 |

\* cited by examiner

LOSSY STATISTICAL DATA COMPRESSION

CROSS REFERENCE TO RELATED APPLICATIONS

This application is a continuation of application Ser. No. 17/168,978, filed Feb. 5, 2021, now U.S. Pat. No. 11,431,350, which application is incorporated herein by reference in its entirety.

TECHNICAL FIELD

The present disclosure is directed to systems and methods of data compression and, more particularly to systems and methods of lossy statistical data compression.

BACKGROUND

Data is a valuable commodity in any number of fields. Data analysis performed on stored data can provide valuable insight that can be used to make informed decisions, create machine learning models, or train artificial intelligence systems. However, the amount of data available is growing every day as more and more devices are connected to the Internet to become "smart." Correspondingly, the costs associated with the storage of that data have grown. Today, mid-size organizations are working with Peta bytes of stored data while larger organizations are dealing with Exabytes of stored data and it is estimated that by the year 2025 there will be 175 Zettabytes of stored data around the world. As the amount of data generated and stored continues to grow exponentially, there is a need to ensure data is processed and stored in an efficient and cost-effective manner. It is with respect to these and other general considerations that the present disclosure is made.

SUMMARY

Lossy statistical data compression of the present disclosure provides an efficient and cost-effective manner of processing and storing growing mountains of data, e.g., "Big Data," by encapsulating time-bounded data into mathematically modelled empirical functions. Stored data that can be represented by these one or more functions can be eliminated in favor of the functions thereby reducing the amount of storage needed and its associated cost.

In the certain aspects, the present disclosure is directed to a method of lossy statistical data compression. The method includes receiving time-based empirical data for a defined period of time and storing the time-based empirical data in a memory storage device. The method further includes dividing the specific period of time into a plurality of time windows and performing a statistical empirical distribution analysis on the empirical data associated with a first one of the plurality of time windows to obtain a first analysis result along with performing a statistical empirical distribution analysis on the empirical data associated with a next one of the plurality of time windows to obtain a second analysis result. The method further includes determining that empirical data associated with the first one of the time windows is within a threshold variance of the empirical data associated with the next one, e.g., the second, of the time windows, and responsive to that determination associating the first analysis result with the second time window and deleting from the memory device the empirical data associated with the second time window. The method further includes generating a representation of the empirical data associated with the first and second time windows from the first analysis result.

In certain aspects, the method is performed in real-time, near real-time, or offline (on-demand). In certain aspects the empirical data comprises empirical network telemetry data. In certain aspects the method additionally includes deleting the empirical data associated with the first time window. In certain aspects, the data being stored and deleted comprises "Big Data." In certain aspects, generating the representation of the empirical data includes generating a graphical representation of the empirical data. In certain aspects, the method further includes analyzing the representation of the data to obtain data relevant to a predetermined desired insight. In certain embodiments, the predetermined desired insight includes one or both of network capacity planning and the occurrence of peak and non-peak network traffic time periods. In certain aspects, the method further includes determining that the empirical data associated with the first time window is not within the threshold variance of the empirical data associated with the second of the time windows and, responsive to this determination, defining the second time window as a new first time window and defining the second analysis result as a new first analysis result, then performing a statistical empirical distribution analysis on the empirical data associated with the new first time window to obtain a new first analysis result and performing a statistical empirical distribution analysis on the empirical data associated with a next one of the plurality of time windows to obtain a second analysis result.

In certain aspects the present disclosure is directed to a method performed in real-time or on demand that includes receiving and storing time-based data over a specific time period and dividing the specific time period into a plurality of time windows. The method further includes determining that data associated with two or more proximate time windows are within a predetermined variance of one another and responsive to the determination: generating a mathematical function (e.g., perform statistical empirical distribution analysis) representative of the data associated with the two or more proximate time windows, deleting the data associated with the two or more proximate time windows, and generating a representation of the deleted data from the mathematical function.

This Summary is provided to introduce a selection of concepts in simplified form that are further described in the Detailed Description. This Summary is not intended to identify key features or essential features of the claimed subject matter, nor is it intended to be used to limit the scope of the claimed subject matter. Additional aspects, features and/or advantages of the concepts can be appreciated from the Detailed Description provided below.

BRIEF DESCRIPTION OF THE DRAWINGS

Non-limiting and non-exhaustive examples are described with reference to the following figures.

DETAILED DESCRIPTION

Various aspects of lossy statistical data compression are described more fully below with reference to the accompanying drawings. It should be appreciated, however, that numerous variations on the disclosed aspects are possible as can be appreciated by those skilled in the art. The various aspects of lossy statistical data compression may be practiced in different forms including methods, systems, or devices. Further, the various aspects of lossy statistical data compression may take the form of a hardware implementation, a software implementation or an implementation combining both hardware and software.

An example of the application of lossy statistical data compression is provided herein in the context of network telemetry. However, it is understood that the described lossy statistical data compression can be applied to any time-based data. Specific examples of additional applications where lossy statistical data compression may be applied include, but are not limited to, network traffic pattern identification and predictions that can be used to detect and prevent outages, long term data storage, and large data migrations.

Lossy statistical data compression of the present disclosure provides an efficient and cost-effective manner of processing and storing growing mountains of data, e.g., "Big Data," by encapsulating time-bounded data into mathematically modelled empirical functions. Stored data that can be represented by these one or more functions can be eliminated in favor of the functions thereby reducing the amount of storage needed and its associated cost.

Accordingly, the lossy statistical data compression of the present disclosure provides a plurality of technical benefits including but not limited to: a reduction in the amount of data that needs to be persistently stored, a reduction in the amount of data storage space used, a reduction in cost associated with the storage space (e.g., less space used=less cost), and an ability to reliably produce a representation of data without having to use the actual data.

Figure 1:
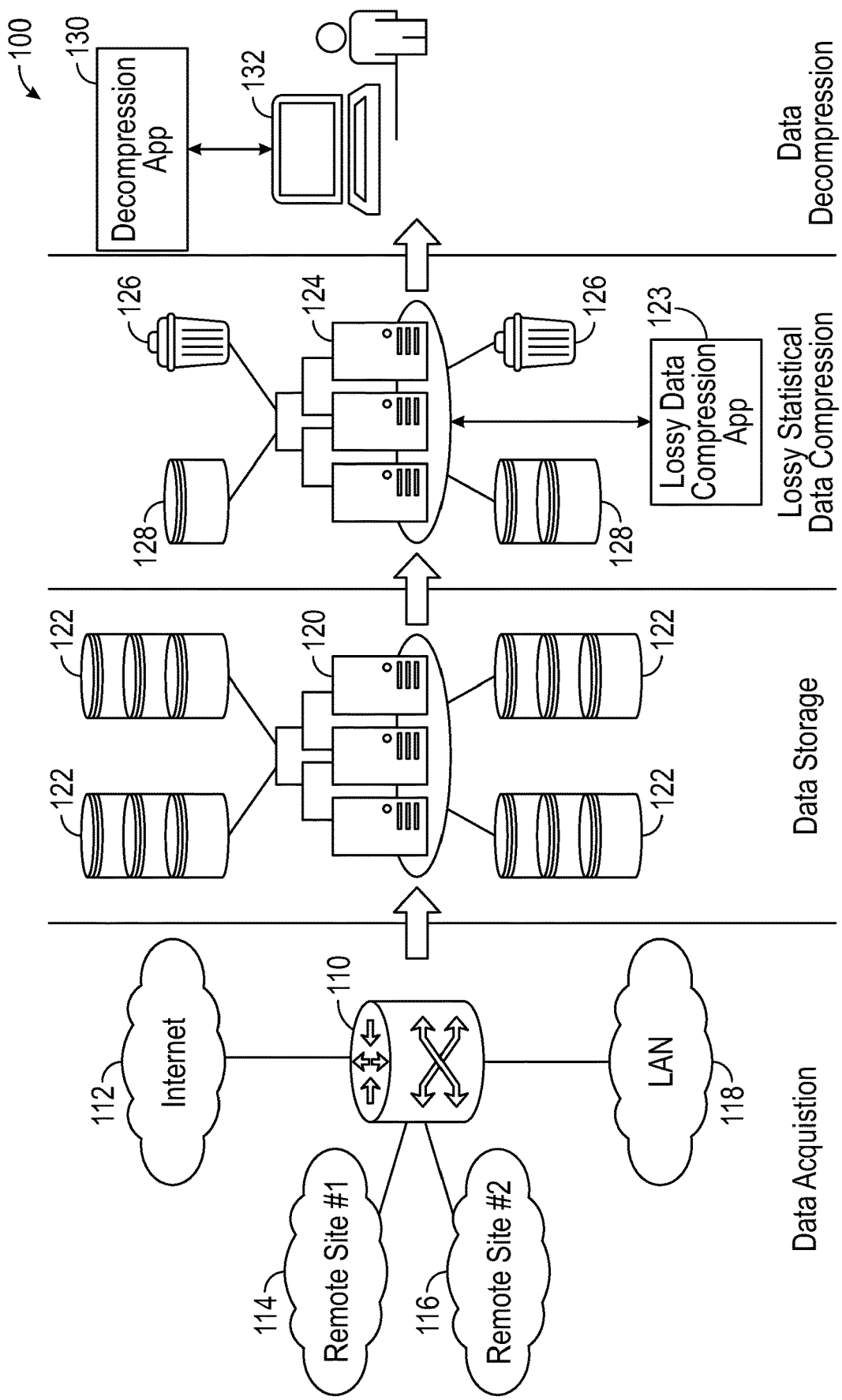
FIG. 1 is a schematic of an example architecture for implementing lossy statistical data compression according to the present disclosure.

FIG. 1 illustrates a simplified overview of an example architecture 100 for implementing lossy statistical data compression according to the present disclosure. As shown, the example architecture 100 is presented in the context of real-time or near real-time network telemetry where routers, switches and firewalls continuously push data related to the network's health to a centralized location for storage and analysis. In the illustrated example, data acquisition occurs via a router 110 that handles two-way data traffic from a plurality of destinations including the Internet 112, a first remote site 114, a second remote site 116 and a local area network (LAN) 118. The router 110 is typically a backbone router or router using Netflow™, which executes network flow monitoring technology to acquire network telemetry data which is pushed to one or more computing devices 120 (e.g., a server computing device) for storage in one or more memory storage devices 122.

The network telemetry data, which is acquired and stored relative to time, can include, for example, attributes of Internet Protocol (IP) packets such as IP source address, IP destination address, source port, destination port, layer 3 protocol type, class of service, router or switch interface, and/or type of service byte (ToS Byte); the acquisition and storage of other network telemetry data is also possible. Any suitable manner of storing the acquired network telemetry data can be used including, for example, flat file storage (e.g., a plain text database), real-time distributed event storage and messaging systems such as Kafka™ or RabbitMQ™, and distributed data storage such as provided by Apache Hadoop™, which can be queried by Apache Hive™; other manners of data storage are also possible.

Figure 2:
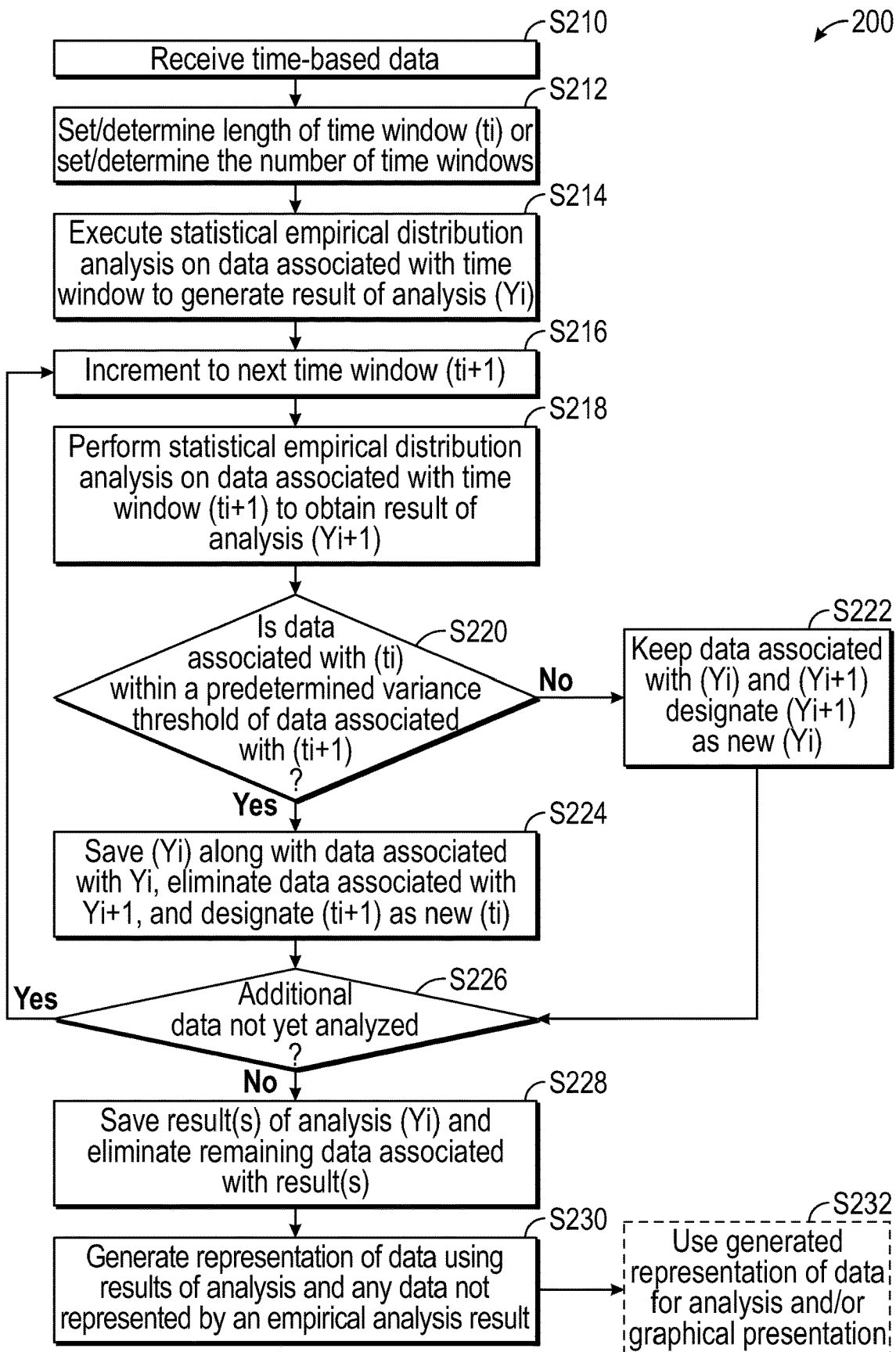
FIG. 2 is a flowchart illustrating a method for lossy statistical data compression.

Once stored, an application for lossy statistical data compression 123, described in further details with reference to FIG. 2, is executed by one or more computing devices 124 (which can be the same or different from the one or more computing devices 120) and applied to the stored network telemetry data such that at least a portion of the data is represented by one or more mathematically modelled empirical functions prompting elimination (e.g., deletion from memory as represented by trash bin 126) of the represented data and resulting in a reduced amount of storage required, as represented the reduced number of memory storage devices 128 (which can be the same or different from the memory storage devices 122). In certain embodiments, the lossy statistical data compression is performed in real-time or near real time, but it is also possible to perform the lossy statistical data compression on demand. In certain embodiments, the lossy statistical data compression is executed through use of instructions coded in an analytics engine such as Apache Spark™, Spark Streaming™ and/or Apache Druid™; other analytics engines may also be used.

The compressed data is then decompressed, for example, by a decompression application 130 on a client computing device 132, for user-analysis wherein a representation of the original, and now eliminated data, is reproduced from the mathematically modelled empirical functions along with any data that was not suited to mathematical modeling. In the context of network telemetry, analysis of the decompressed data is used, for example, to obtain insight into traffic and bandwidth usage for informed network capacity planning and/or to obtain insight into when peak and non-peak traffic time periods occur; data analysis for other uses may also be performed.

Referring now to the flowchart of FIG. 2, a method 200 for lossy statistical data compression can be appreciated. As shown, the method 200 includes receiving time-based data, S210, with each point in time associated with a single data point; the data received is considered "Big Data" in that the amount and velocity of data is, for example thousands of datapoints per hour. It should be noted that time can be measured in any suitable increment to provide a desired insight to the data including, for example, microseconds, seconds, minutes, hours, days, months, and years or any division thereof.

The method 200 further includes setting or determining a length of time to be associated with the time window and/or setting or determining a number of time windows into which the time period is to be divided, S212. For example, a time window ($t_i$) of 10 seconds can be selected for an overall time period of five minutes or a 12 hour time window ($t_i$) can be selected for an overall time period of 30 days. In another example, an overall time period is divided into 15 time windows. In certain embodiments, the number of time windows into which the overall time period is to be divided is a pre-determined number while in other embodiments a user entry (e.g., manual entry of number or selection from a menu) decides the number of time windows into which the overall time period is to be divided. In certain embodiments, rather than a number of windows, or in addition thereto, a length of time of the time window is predetermined or user-entered. In certain embodiments, each of the time windows is of a consistent length while in other embodiments at least two of the time windows are of different lengths of time.

Continuing with method 200, a statistical empirical distribution analysis is executed on the data associated with the first time window (ti) and a result of the analysis (Yi) is generated, S214. In statistics an empirical distribution function is the distribution function associated with an empirical measure of observed data. This cumulative distribution function is a step function that jumps up by 1/n at each of the n data points. Its value at any specified value of the measured variable is a fraction of the observations of the measured variable that are less than or equal to the specified value. The empirical distribution function is an estimate of the cumulative distribution function that generated the data points in the sample. It converges with probability 1 to that underlying distribution.

Further, the method includes incrementing the time window, e.g. (ti+1), to obtain the next time window and the data associated therewith, S216. The statistical empirical distribution analysis is executed on the data associated with the next time window (ti+1) to generate results of (Yi+1), S218. The data associated with time window (ti) is then compared to the data associated with time window (ti+1) to determine if the data associated with time window (ti) is within a predetermined variance threshold of the data associated with (ti+1), for example, the data associated with (ti) is within ±1%, ±5 or ±10% of (ti+1), S220; other variance thresholds are also possible. The data associated with time window (ti) being within the predetermined variance threshold of the data associated with time window (ti+1) indicates the data sets are suited for a best fit analysis.

If the data associated with time window (ti) is not within a predetermined variance threshold of the data associated with time window (ti+1), S220: NO, all data associated with the time window (ti) and result (Yi) as well as all data associated with the time window (ti+1) and result (Yi+1) is maintained and the result (Yi+1) is designated as the new result (Yi), S222.

If the data associated with time window (ti) is within a predetermined variance threshold of the data associated with time window (ti+1), S220: YES, then, the result (Yi) is saved to memory along with its associated data while the data associated with the result (Yi+1) is eliminated (e.g., erased or deleted from memory) as it can be represented with the result (Yi). Further, the time window (ti+1) is designated as the new (ti), S224.

The method 200 continues from either S222 or S224, where it is determined if there is additional data within the data sample that has not been subjected to the empirical data analysis, S226. If there is additional data to be analyzed, S226: YES, control returns to S216 to increment to the next time window (ti+1) and its associated data for execution of the statistical empirical distribution analysis, S218.

If there is no further data to subject to the statistical empirical data analysis, S226: NO, any results (Yi) not yet stored to memory are stored and any remaining data that is represented by one or more results (Yi) of the statistical empirical data analysis is deleted from memory freeing additional memory space, S228.

Continuing with the method 200, the one or more results (Yi) of the statistical empirical data analysis for the various time windows, along with any data not represented by a statistical empirical data analysis result (Yi), are used to generate a representation of the original data, S230. Optionally, the generated representation of the data can be used for analysis and/or for generating a graphical presentation of the representation of the original data, S232. For example, based on a predetermined desired insight, the representation of the original data is analyzed to obtain data relevant to the predetermined desired insight.

Accordingly, at least a portion of the originally obtained data has been compressed into one or more statistical empirical data analysis results (Yi), in the form of one or more mathematical functions, and memory storage previously occupied by the original data has been freed responsive to the execution of the method 200 for lossy statistical data compression.

Figure 3:
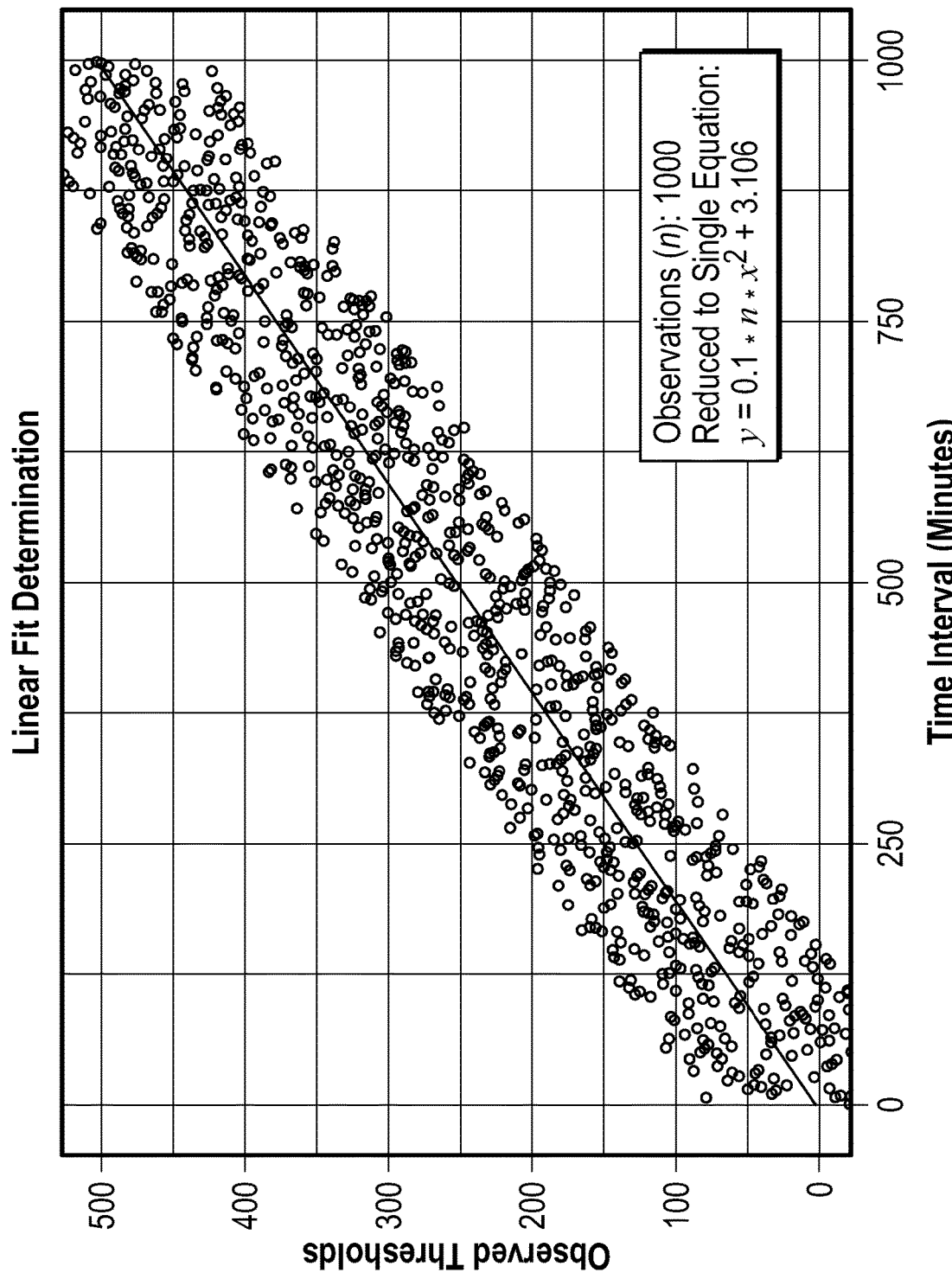
FIG. 3 is simplified example of a graphical representation generated from the results of statistical empirical data analysis under lossy statistical data compression.

FIG. 3 illustrates simplified example of a graphical presentation generated from the results of the statistical empirical data analysis. In this instance, observed thresholds for each minute of a 1000 minute time interval are represented by a single statistical empirical data analysis result (Yi), e.g., a line, in the form of $y=0.1*n*x^2+3.106$, where n is the number of observations.

Figure 4:
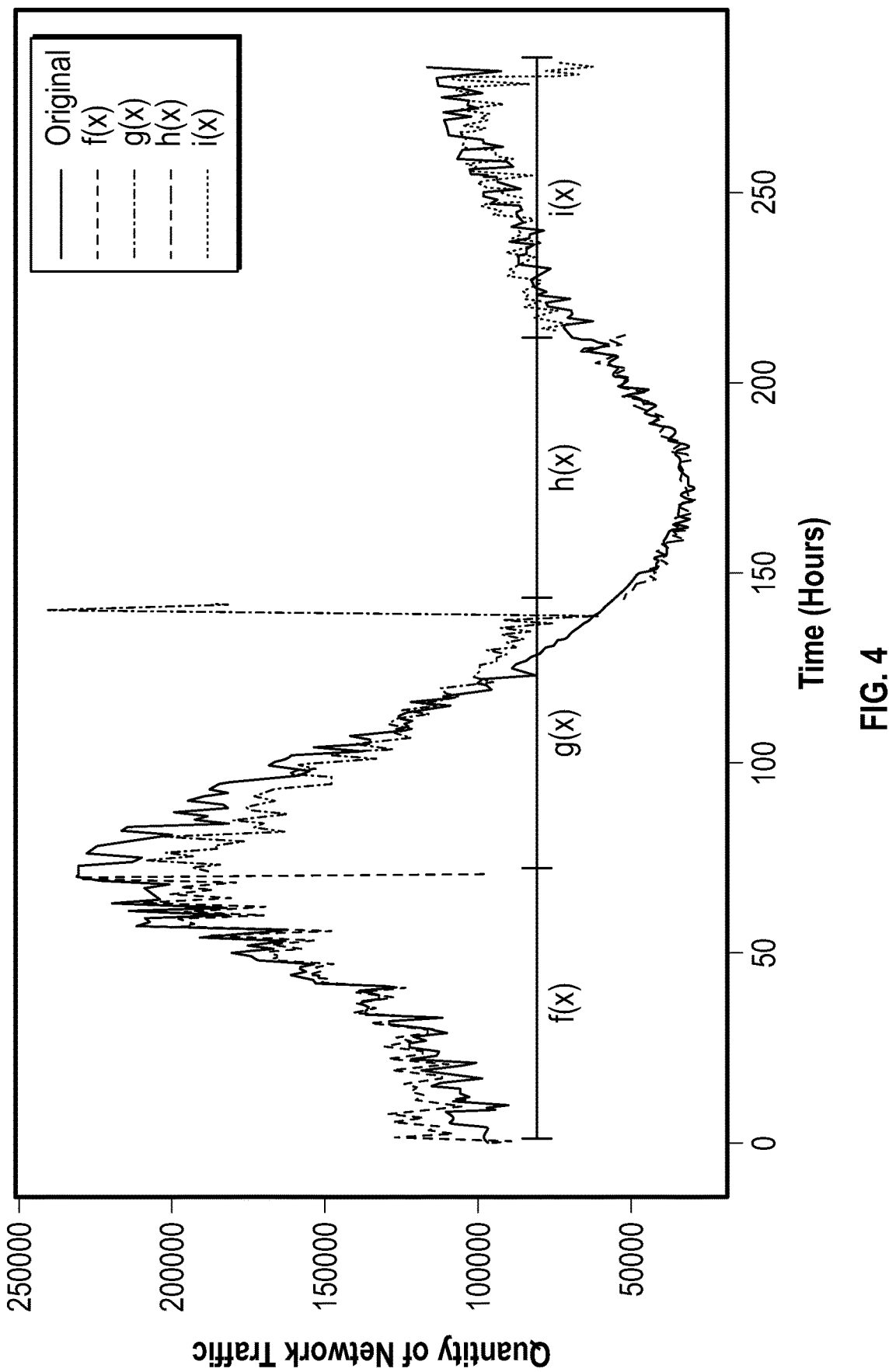
FIG. 4 is an example simplified example of a graphical representation generated from the results of statistical empirical data analysis under lossy statistical data compression.

FIG. 4 is an example of a graphical representation generated from the results of the statistical empirical data analysis under lossy statistical data compression. In this instance the original data, indicated with a solid line, represents a quantity of network traffic over time measured in hours. A first statistical empirical data analysis result obtained under lossy statistical data compression is used to generate data representative of a first portion of the original data. Similarly, second, third and fourth empirical data analysis results, g(x), h(x), and i(x), respectively, obtained under lossy statistical data compression is used to generate data representative of second, third and fourth portions of the original data. Further, the original data that supported the generation of f(x), g(x), h(x) and i(x) has been deleted from memory.

Figure 5:
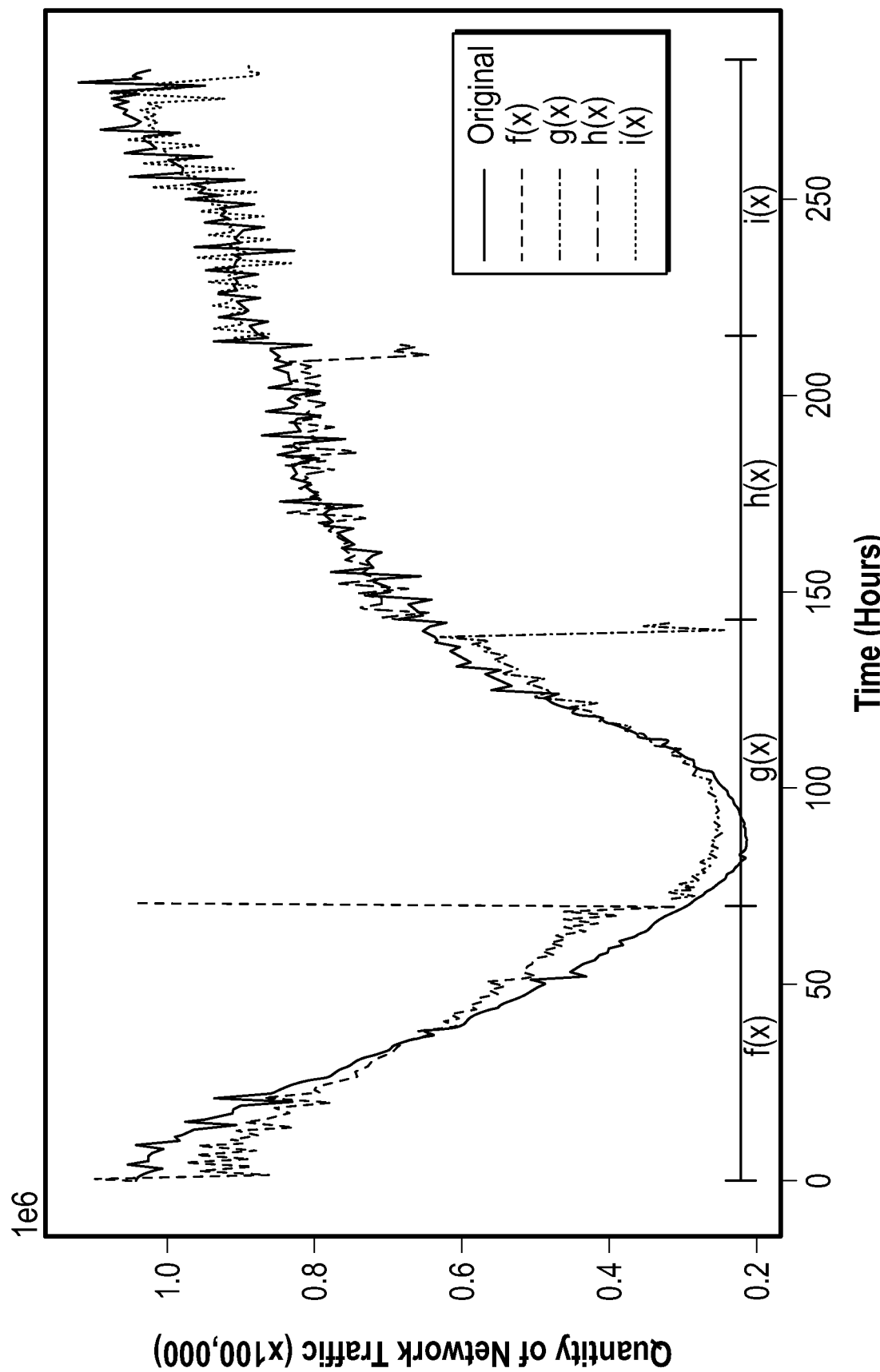
FIG. 5 is an example simplified example of a graphical representation generated from the results of statistical empirical data analysis under lossy statistical data compression.

FIG. 5 is another example of a graphical representation generated from the results of the statistical empirical data analysis under lossy statistical data compression. Once again, the original data, indicated with a solid line, represents a quantity of network traffic over time measured in hours. A first statistical empirical data analysis result f(x) obtained under lossy statistical data compression is used to generate data representative of a first portion of the original data. Similarly, second, third and fourth empirical data analysis results, g(x), h(x), and i(x), respectively, obtained under lossy statistical data compression is used to generate data representative of second, third and fourth portions of the original data. Further, the original data that supported the generation of f(x), g(x), h(x) and i(x) has been deleted from memory.

Figure 6:
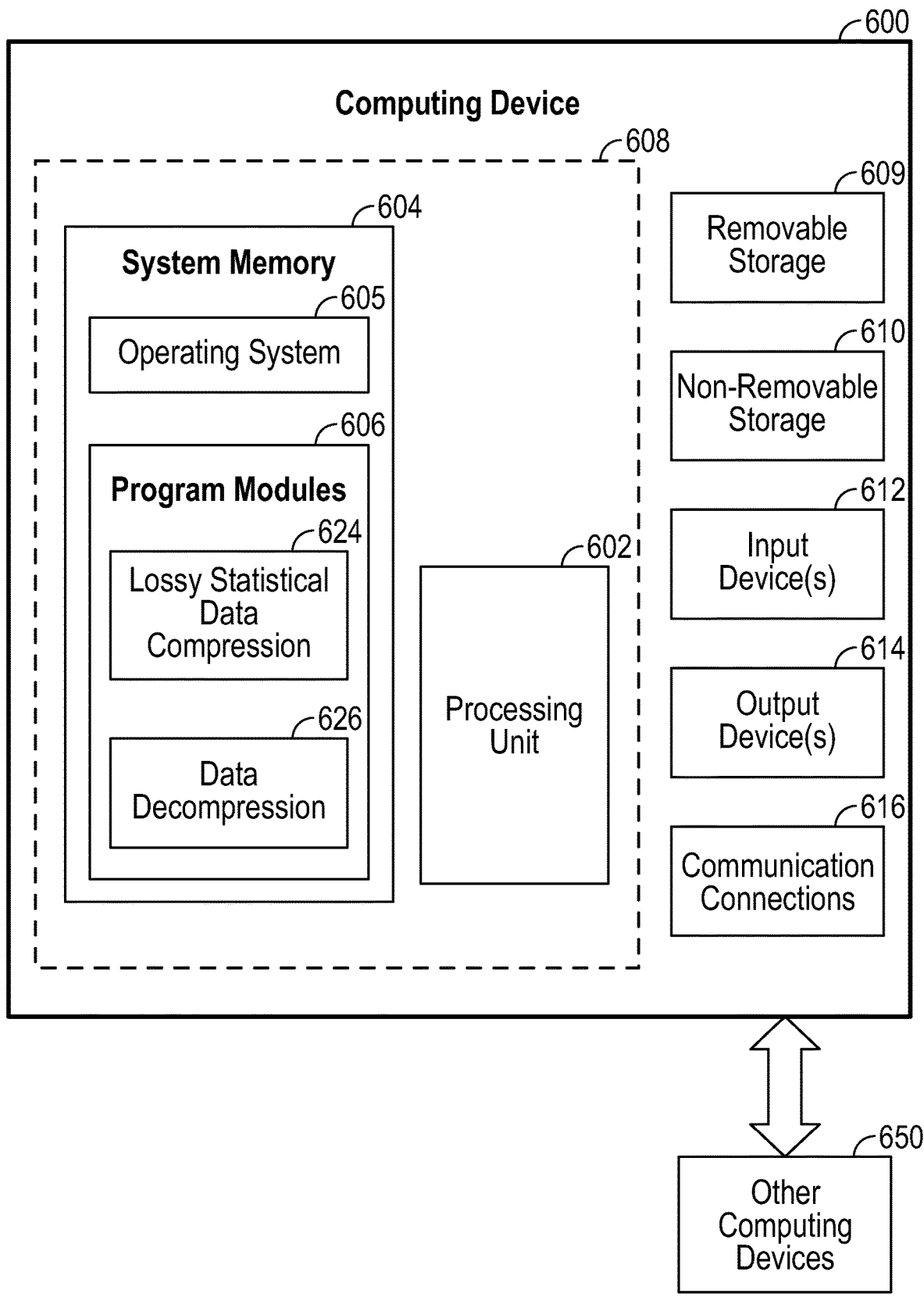
FIG. 6 is a block diagram illustrating example physical components of a computing device with which aspects of the disclosure may be practiced.

FIG. 6 is a block diagram illustrating physical components (e.g., hardware) of a computing device 600 with which aspects of the disclosure may be practiced. The computing device components described below may be suitable for the computing devices described above, including the computing devices 120, 124 and 132. In a basic configuration, the computing device 600 may include at least one processing unit 602 and a system memory 604. Depending on the configuration and type of computing device, the system memory 604 may comprise, but is not limited to, volatile storage (e.g., random access memory), non-volatile storage (e.g., read-only memory), flash memory, or any combination of such memories.

The system memory 604 may include an operating system 605 and one or more program modules 606 suitable for running software application, such as one or more components supported by the systems described herein. As examples, system memory 604 may include lossy statistical data compression application 624 and a decompression application 626. The operating system 605, for example, may be suitable for controlling the operation of the computing device 600.

Furthermore, embodiments of the disclosure may be practiced in conjunction with a graphics library, other operating systems, or any other application program and is not limited to any particular application or system. This basic configuration is illustrated in FIG. 6 by those components within a dashed line 608. The computing device 600 may have additional features or functionality. For example, the computing device 600 may also include additional data storage devices (removable and/or non-removable) such as, for example, magnetic disks, optical disks, or tape. Such additional storage is illustrated in FIG. 6 by a removable storage device 609 and a non-removable storage device 610.

As stated above, a number of program modules and data files may be stored in the system memory 604. While executing on the processing unit 602, the program modules 606 may perform processes including, but not limited to, the aspects, as described herein. Other program modules that may be used in accordance with aspects of the present disclosure may include network flow monitoring applications, distributed data storage applications, and analytics applications.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. For example, embodiments of the disclosure may be practiced via a system-on-a-chip (SOC) where each or many of the components illustrated in FIG. 6 may be integrated onto a single integrated circuit. Such an SOC device may include one or more processing units, graphics units, communications units, system virtualization units and various application functionality all of which are integrated (or "burned") onto the chip substrate as a single integrated circuit. When operating via an SOC, the functionality, described herein, with respect to the capability of client to switch protocols may be operated via application-specific logic integrated with other components of the computing device 600 on the single integrated circuit (chip). Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

The computing device 600 may also have one or more input device(s) 612 such as a keyboard, a mouse, a pen, a sound or voice input device, a touch or swipe input device, etc. The output device(s) 614 such as a display, speakers, a printer, etc. may also be included. The aforementioned devices are examples and others may be used. The computing device 600 may include one or more communication connections 616 allowing communications with other computing devices 650. Examples of suitable communication connections 616 include, but are not limited to, radio frequency (RF) transmitter, receiver, and/or transceiver circuitry; universal serial bus (USB), parallel, and/or serial ports.

The term computer readable media as used herein may include computer storage media. Computer storage media may include volatile and nonvolatile, removable, and non-removable media implemented in any method or technology for storage of information, such as computer readable instructions, data structures, or program modules. The system memory 604, the removable storage device 609, and the non-removable storage device 610 are all computer storage media examples (e.g., memory storage). Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 600. Any such computer storage media may be part of the computing device 600. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

Aspects of the present disclosure, for example, are described above with reference to block diagrams and/or operational illustrations of methods, systems, and computer program products according to aspects of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed:

1. A method of lossy statistical data compression, comprising:
   receiving and storing device time-based empirical data representing a specific time period;
   dividing the specific time period into a plurality of time windows;
   generating a first mathematical function representation of the received data associated with a first time window of the time period;
   generating a next mathematical function representation of the received data associated with a next time window of the time period;
   determining whether the received data associated with the first time window and the received data associated with the next time window are within a predetermined variance of one another; and
   responsive to the determination:
      saving the received data associated with the first time window of the time period;
      saving the generated mathematical function representation associated with the first time window; and
      deleting the received data associated with the next time window.

2. The method of claim 1, wherein the first time period and the next time period are adjacent time windows in the specific time period.

3. The method of claim 1, wherein responsive to the determination further comprises:
   the next time window becomes a new first time window;
   obtaining a new next time window by incrementing the new first time window by one time window; and
   generating mathematical function representations of the received data associated with the new first time window and the new next time window.

4. The method of claim 1, wherein generating a mathematical function representation of the data comprises performing a statistical empirical distribution analysis on the data to obtain an analysis result.

5. The method of claim 1, further comprising:
   generating a graphical presentation of the data associated with the first time window from the first mathematical function representation; and
   generating a graphical presentation of the data associated with the next time window from the next mathematical function representation.

6. The method of claim 1, further comprising deleting the received data associated with the first time window.

7. The method of claim 1, wherein if the received data associated with the first time window and the received data associated with the next time window are not within a predetermined variance of one another:
   retaining the received data associated with the first time window and the received data associated with the next time window; and
   incrementing the time window such that the next time window becomes the first time window, wherein the next time window is obtained by incrementing the first time window by one time window.

8. A method of lossy statistical data compression for network telemetry data, comprising:
   receiving and storing device time-based empirical network telemetry data representing a specific time period;
   dividing the specific time period into a plurality of time windows;
   generating a first mathematical function representation of the received network telemetry data associated with a first time window of the time period;
   generating a next mathematical function representation of the received network telemetry data associated with a next time window of the time period;
   determining whether the received network telemetry data associated with the first time window and the received network telemetry data associated with the next time window are within a predetermined variance of one another; and
   responsive to the determination:
      saving the received network telemetry data associated with the first time window of the time period;
      saving the generated mathematical function representation associated with the first time window; and
      deleting the received network telemetry data associated with the next time window.

9. The method of claim 8, wherein the first time period and the next time period are adjacent time windows in the specific time period.

10. The method of claim 8, wherein responsive to the determination further comprises:
    the next time window becomes a new first time window;
    obtaining a new next time window by incrementing the new first time window by one time window; and
    generating mathematical function representations of the received network telemetry data associated with the new first time window and the new next time window.

11. The method of claim 8, wherein generating a mathematical function representation of the received network telemetry data comprises performing a statistical empirical distribution analysis on the data to obtain an analysis result.

12. The method of claim 8, further comprising:
    generating a graphical presentation of the received network telemetry data associated with the first time window from the first mathematical function representation; and
    generating a graphical presentation of the received network telemetry data associated with the next time window from the next mathematical function representation.

13. The method of claim 8, further comprising deleting the received network telemetry data associated with the first time window.

14. The method of claim 8, wherein if the received network telemetry data associated with the first time window and the received network telemetry data associated with the next time window are not within a predetermined variance of one another:
    retain the received network telemetry data associated with the first time window and the received network telemetry data associated with the next time window; and
    increment the time window such that the next time window becomes the first time window, wherein the next time window is obtained by incrementing the first time window by one time window.

15. A method of lossy statistical data compression, comprising:
    receiving and storing in a memory storage device time-based data for a specific time period;
    dividing the specific time period into a plurality of time windows; and
    determining whether received data associated with two or more proximate time windows are within a predetermined variance of one another;

responsive to the determination:
- generating a mathematical function representation of the received data associated with the two or more proximate time windows; and
- deleting the received data associated with the two or more proximate time windows from the memory storage device.

16. The method of claim 15, wherein the two or more proximate time windows are adjacent time windows in the specific time period.

17. The method of claim 15, wherein generating a mathematical function representation of the received data comprises performing a statistical empirical distribution analysis on the received data to obtain an analysis result.

18. The method of claim 15, further comprising:
- generating a graphical presentation of the received data associated with the two or more proximate time windows from the generated mathematical function representation.

19. The method of claim 15, further comprising data compression by:
- representing the received data associated with the two or more proximate time windows with the generated mathematical function representation; and
- deleting the received data associated with the two or more proximate time windows.

20. The method of claim 15, further comprising:
- reproducing the deleted received data by generating a mathematical function representation of the deleted data.

* * * * *